(12) United States Patent
Maruyama

(10) Patent No.: US 6,927,994 B2
(45) Date of Patent: Aug. 9, 2005

(54) FERROELECTRIC MEMORY DEVICE

(75) Inventor: Akira Maruyama, Yokohama (JP)

(73) Assignee: Seiko Epson Corporation, Tokyo (JP)

( * ) Notice: Subject to any disclaimer, the term of this patent is extended or adjusted under 35 U.S.C. 154(b) by 17 days.

(21) Appl. No.: 10/754,691

(22) Filed: Jan. 12, 2004

(65) Prior Publication Data
US 2004/0213033 A1 Oct. 28, 2004

(30) Foreign Application Priority Data
Jan. 16, 2003 (JP) ............................ 2003-008461

(51) Int. Cl.$^7$ ............................................. G11C 11/22
(52) U.S. Cl. ........................................ 365/145; 365/226
(58) Field of Search ................................ 365/145, 226

(56) References Cited

U.S. PATENT DOCUMENTS 5,373,463 A * 12/1994 Jones, Jr. ................. 365/145
5,602,784 A * 2/1997 Kojima et al. ......... 365/189.09

FOREIGN PATENT DOCUMENTS

JP  A 9-116107  5/1997

OTHER PUBLICATIONS

U.S. Appl. No. 10/393,439, filed Mar. 20, 2003, Yamamura.
U.S. Appl. No. 10/747,395, filed Dec. 30, 2003, Maruyama.
U.S. Appl. No. 10/747,523, filed Dec. 30, 2003, Maruyama.
U.S. Appl. No. 10/737,959, filed Dec. 18, 2003, Maruyama.
U.S. Appl. No. 10/752,184, filed Jan. 7, 2004, Maruyama.
U.S. Appl. No. 10/758,179, filed Jan. 16, 2004, Maruyama.

* cited by examiner

Primary Examiner—Michael Tran
(74) Attorney, Agent, or Firm—Oliff & Berridge, PLC

(57) ABSTRACT

A high-speed accessible ferroelectric memory device includes ferroelectric capacitors (memory cells) at respective intersecting points of a plurality of word lines and a plurality of bit lines. A voltage supply line for a selected word line and a voltage supply line for an unselected word line are connected with a word line driver section which drives the word lines. A voltage supply line for a selected bit line and a voltage supply line for an unselected bit line are connected with a bit line driver section which drives the bit lines. A voltage select circuit which selects the voltages of the supply lines fixes the potential of one of the voltage supply line for the unselected word line and the voltage supply line for the unselected bit line in both cases of applying a positive and negative select voltages to a selected memory cell (read period and write period).

6 Claims, 15 Drawing Sheets

FERROELECTRIC MEMORY DEVICE

Japanese Patent Application No. 2003-8461 filed on Jan. 16, 2003, is hereby incorporated by reference in its entirety.

BACKGROUND OF THE INVENTION

The present invention relates to a ferroelectric memory device.

As a ferroelectric memory device, an active ferroelectric memory device including 1T/1C cells in which one transistor and one ferroelectric capacitor are disposed in each cell, or including 2T/2C cells in which a reference cell is further disposed in each cell, has been known.

However, since an active ferroelectric memory device has a large memory area in comparison with a flash memory or EEPROM which is known as a nonvolatile memory device in which a memory cell is formed by one element, the capacity cannot be increased.

As a nonvolatile memory device which can be increased in capacity, a ferroelectric memory device in which each memory cell is formed by one ferroelectric capacitor has been proposed (see Japanese Patent Application Laid-open No. 9-116107).

In the ferroelectric memory device in which each memory cell is formed by one ferroelectric capacitor, a plurality of types of voltages must be selectively supplied to a selected word line, unselected word line, selected bit line, and unselected bit line. The number of unselected memory cells is considerably greater than the number of selected memory cells connected with the selected word line and the selected bit line. Therefore, the interconnect load differs between each line to a large extent.

In particular, since the interconnect load of the unselected word line and the unselected bit line is large, a comparatively long period of time is necessary to change the potentials of the unselected word line and the unselected bit line. This results in a decrease in the access speed.

BRIEF SUMMARY OF THE INVENTION

The present invention may provide a ferroelectric memory device capable of reducing the access time.

A ferroelectric memory device according to the present invention includes:

a plurality of word lines disposed in parallel;

a plurality of bit lines disposed in parallel so as to intersect the word lines;

a plurality of ferroelectric memory cells disposed at respective intersecting points of the word lines and the bit lines;

a word line driver section which drives the word lines;

a bit line driver section which drives the bit lines;

a first voltage supply line and a second voltage supply line which are connected with the word line driver section, the first voltage supply line being used for a selected word line among the word lines, and the second voltage supply line being used for an unselected word line among the word lines;

a third voltage supply line and a fourth voltage supply line which are connected with the bit line driver section, the third voltage supply line being used for a selected bit line among the bit lines, and the fourth voltage supply line being used for an unselected bit line among the bit lines;

a power supply circuit which generates a plurality of types of voltages; and a voltage select circuit which selectively outputs the plurality of types of voltages generated by the power supply circuit to the first voltage supply line, the second voltage supply line, the third voltage supply line, and the fourth voltage supply line, wherein the word line driver section and the bit line driver section apply a select voltage to a selected memory cell among the ferroelectric memory cells, and apply an unselect voltage to a remaining unselected memory cell among the memory cells, and wherein the voltage select circuit fixes a potential of one of the second voltage supply line and the fourth voltage supply line when the select voltage is applied to the selected memory cell.

In the present invention, the memory access speed can be increased by fixing the potential of one of the voltage supply line for the unselected word line and the voltage supply line for the unselected bit line which has a large connection load and a low charge/discharge speed.

The power supply circuit may generate five types of voltages consisting of a voltage $V0$, a voltage $V1$, a voltage $V2$, a voltage $V3$ and a voltage $V4$, a relationship of magnitude of the voltages $V0$ to $V4$ being expressed by $V0<V1<V2<V3<V4$. In this case, the voltage select circuit may fix the second voltage supply line at the voltage $V2$, as one example. The voltage select circuit may supply the voltage $V4$ to the first voltage supply line, the voltage $V3$ to the fourth voltage supply line, and the voltage $V1$ to the third voltage supply line when the select voltage applied to the selected memory cell is positive, and may supply the voltage $V0$ to the first voltage supply line, the voltage $V1$ to the fourth voltage supply line, and the voltage $V3$ to the third voltage supply line when the select voltage applied to the selected memory cell is negative.

This ferroelectric memory device may include a control circuit which outputs a timing signal for selectively outputting the plurality of types of voltages to the first voltage supply line, the second voltage supply line, the third voltage supply line, and the fourth voltage supply line to the voltage select circuit.

This control circuit may output a signal which causes a voltage supplied to the first voltage supply line to be changed from the voltage $V4$ to the voltage $V2$ after the select voltage that is positive has been applied to the selected memory cell. And then the control circuit may output a signal which cause a voltage applied to the first voltage supply line to be changed from the voltage $V2$ to the voltage $V0$, a voltage applied to the fourth voltage supply line to be changed from the voltage $V3$ to the voltage $V1$, and a voltage applied to the third voltage supply line to be changed from the voltage $V1$ to the voltage $V2$ substantially at the same time.

This control circuit may output a signal which causes a voltage supplied to the first voltage supply line to be changed from the voltage $V4$ to the voltage $V2$ after the select voltage that is positive has been applied to the selected memory cell, and then may output a signal which cause a voltage applied to the fourth voltage supply line to be changed from the voltage $V3$ to the voltage $V1$, and a voltage applied to the third voltage supply line to be changed from the voltage $V1$ to the voltage $V3$ substantially at the same time.

As another example, the voltage select circuit may fix the fourth voltage supply line at the voltage $V2$ instead of the second voltage supply line. In this case, the voltage select circuit may supply the voltage $V3$ to the first voltage supply line, the voltage V1 to the second voltage supply line, and the voltage V0 to the third voltage supply line when the select voltage applied to the selected memory cell is positive, and may supply the voltage V1 to the first voltage supply line, the voltage V3 to the second voltage supply line, and the voltage V4 to the third voltage supply line when the select voltage applied to the selected memory cell is negative.

The control circuit may output a signal which causes a voltage supplied to the first voltage supply line to be changed from the voltage V3 to the voltage V1 after the select voltage that is positive has been applied to the selected memory cell, and then may output a signal which cause a voltage applied to the second voltage supply line to be changed from the voltage V1 to the voltage V3, and a voltage applied to the third voltage supply line to be changed from the voltage V0 to the voltage V2 substantially at the same time.

DETAILED DESCRIPTION OF THE EMBODIMENT

An embodiment of the present invention is described below with reference to the drawings.

Basic Configuration of Ferroelectric Memory Device

Figure 1:
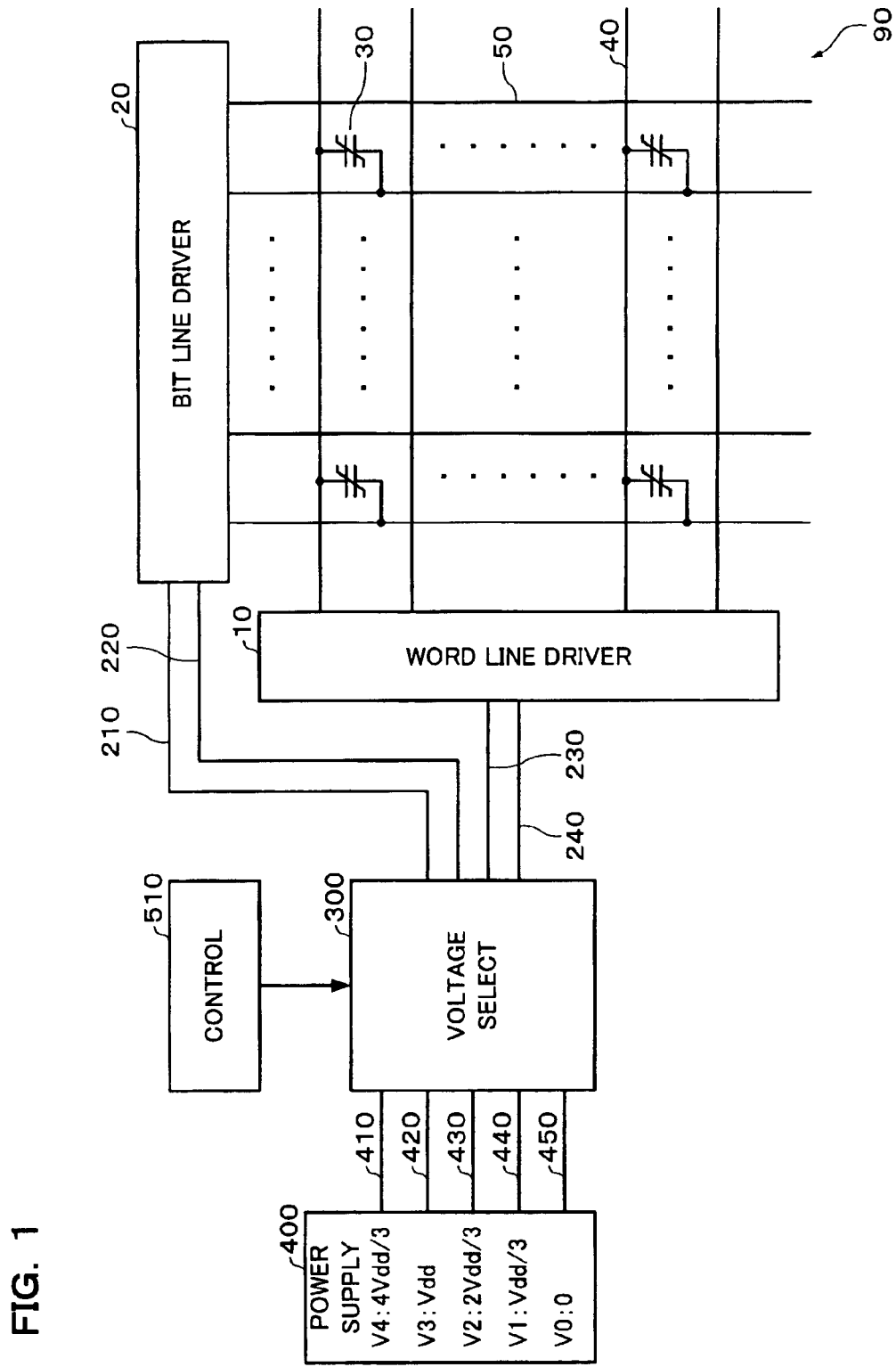
FIG. 1 is a block diagram of a ferroelectric memory device according to an embodiment of the present invention.

The basic operation of a ferroelectric memory device is described below. FIG. 1 is an overall diagram of a ferroelectric memory device according to the present invention.

The ferroelectric memory device shown in FIG. 1 has a structure in which a plurality of ferroelectric capacitors (memory cells) 30 are disposed at intersecting points of a plurality of word lines 40 and a plurality of bit lines 50 arranged in the shape of a matrix. A specific memory cell 30 is selected from the memory cells 30 by selecting one word line 40 and one bit line 50.

In a computer, one bit is considered as the amount of information capable of expressing two states. A ferroelectric memory device is a memory device which utilizes two states which appear in a hysteresis phenomenon of the ferroelectric capacitor 30 as one bit.

Figure 2:
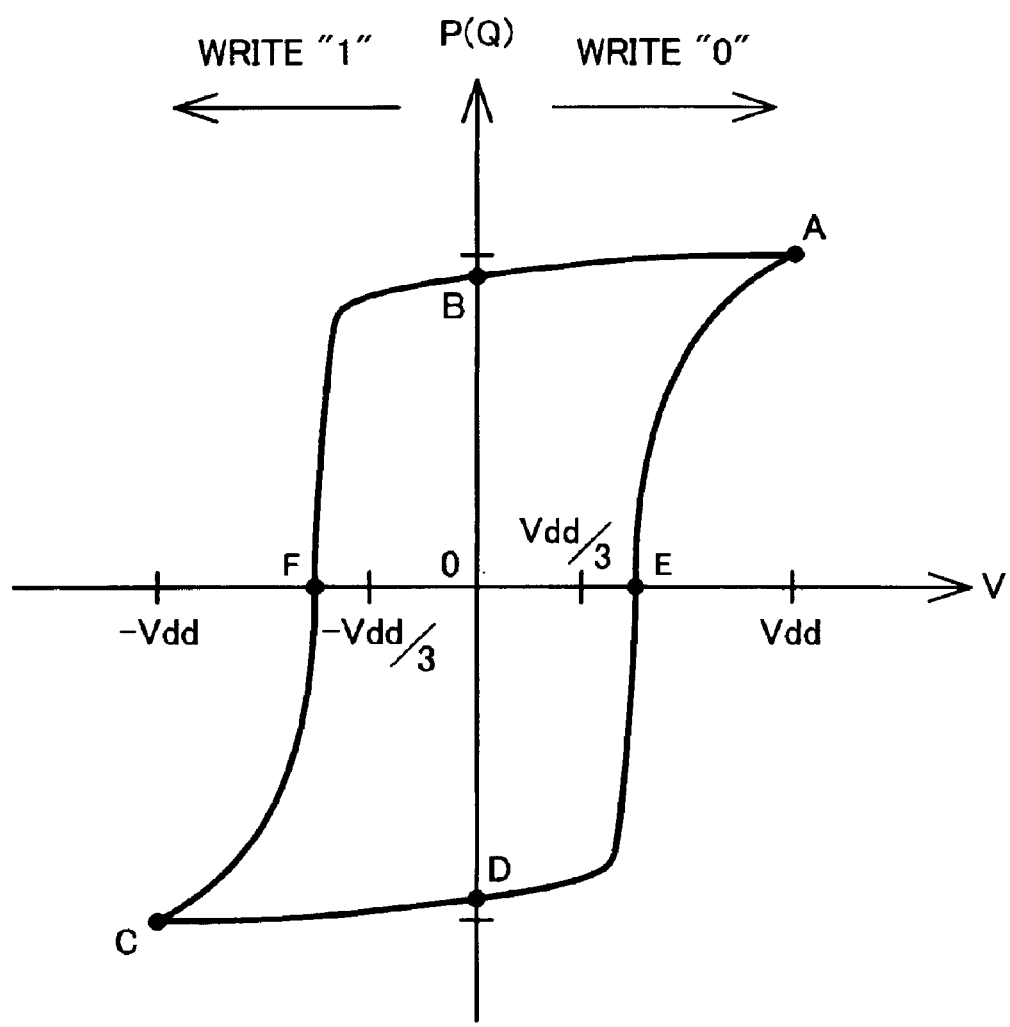
FIG. 2 shows a hysteresis phenomenon of a ferroelectric.

The hysteresis phenomenon is described below with reference to FIG. 2, which shows the correlation between the voltage applied to a ferroelectric and the polarization of the ferroelectric. In FIG. 2, the vertical axis P (Q) indicates the polarization (amount of charge) of the ferroelectric, and the horizontal axis V indicates the voltage applied to the ferroelectric. The curve shown in FIG. 2 indicates characteristics in which the polarization state of the ferroelectric capacitor 30 cycles corresponding to the change in the voltage applied to the ferroelectric capacitor 30. For example, when a positive select voltage Vdd is applied to the ferroelectric capacitor 30 which is in the state at a point B (memory state of logic value "0") or the state at a point D (memory state of logic value "1"), the polarization state transitions to a point A (reading of logic value "0" or "1"). When the applied voltage is changed to 0, the polarization state transitions to the point B. Specifically, the polarization state which has been originally at the point D transitions to the point B through the point A. When a negative select voltage (−Vdd) is then applied to the ferroelectric capacitor 30, the polarization state transitions to a point C (writing of logic value "1"). When the applied voltage is changed to 0, the polarization state transitions to the point D (memory state of logic value "1").

An unselect voltage (±Vdd/3) is applied to the ferroelectric capacitor 30 which is in a polarization state at the point B or the point D. When the applied voltage is changed to 0, the polarization state returns to the original point B or point D. This shows that the memory state is maintained even if the unselect voltage (±Vdd/3) is applied to the unselected ferroelectric capacitor 30 when one ferroelectric capacitor 30 is selected.

Reading and writing of data in the ferroelectric memory device are described below.

Writing of data "0" and writing of data "1" are necessary when writing data. Since the direction of the applied voltage must be reversed when writing data "0" and writing data "1" because of the characteristics of the ferroelectric capacitor 30, a step of writing data "0" and a step of writing data "1" are required.

Since this ferroelectric memory device is a destructive read type ferroelectric memory device, a rewrite operation is necessary after reading data. Therefore, read and rewrite are necessary when reading data. In the first read step, a state retained in the ferroelectric capacitor 30 is read from the amount of charge transfer in the ferroelectric capacitor 30 by applying a voltage in the same direction as the direction when writing data "0". In the subsequent rewrite step, data "1" is rewritten to only the memory cells in which data "1" has been originally stored.

As described above, writing of data "0" and writing of data "1" are necessary when reading data and writing data.

In the present specification, writing of data "0", in which the positive select voltage (Vdd) is applied to the selected memory cell, is defined as "read", and writing of data "1", in which the negative select voltage (-Vdd) is applied to the selected memory cell, is defined as "write".

Peripheral Circuit Configuration of Memory Cell Array

In a memory cell array 90 shown in FIG. 1, the word lines 40 and the bit lines 50 are arranged in the shape of a matrix. The ferroelectric capacitors (memory cells) 30 are disposed at intersecting points of the word lines 40 and the bit lines 50.

A power supply circuit 400 shown in FIG. 1 generates five types of voltages V0 to V4 (V4=4Vdd/3, V3=Vdd, V2=2Vdd/3, V1=Vdd/3, V0=0). The voltage V4 (4Vdd/3) is added to four types of voltages V0 to V3 used in a conventional 1/3 bias drive method. In the present embodiment, the voltage V4 (4Vdd/3) is generated by increasing the power supply voltage Vdd. However, the present invention is not limited thereto. Voltage output lines 410 to 450 for outputting the five types of voltages V0 to V4 to a voltage select circuit 300 are provided to the power supply circuit 400.

A voltage supply line 210 for a selected bit line (a third voltage supply line) and a voltage supply line 220 for an unselected bit line (a fourth voltage supply line) connect a bit line driver section 20 with the voltage select circuit 300. A voltage supply line 230 for a selected word line (a first voltage supply lines) and a voltage supply line 240 for an unselected word line (a second voltage supply line) connect a word line driver section 10 with the voltage select circuit 300.

The voltage select circuit 300 selects four types of voltages from the five types of voltages V0 to V4 according to signals input from a control circuit 510, and outputs the selected voltages to the voltage supply line 210 for the selected bit line, the voltage supply line 220 for the unselected bit line, the voltage supply line 230 for the selected word line, and the voltage supply line 240 for the unselected word line.

The word line driver section 10 and the bit line driver section 20 selectively connect the voltage supply lines 210 to 240, which are connected with each of the memory cells 30, with the word lines 40 and the bit lines 50.

Read and Write

Figure 3:
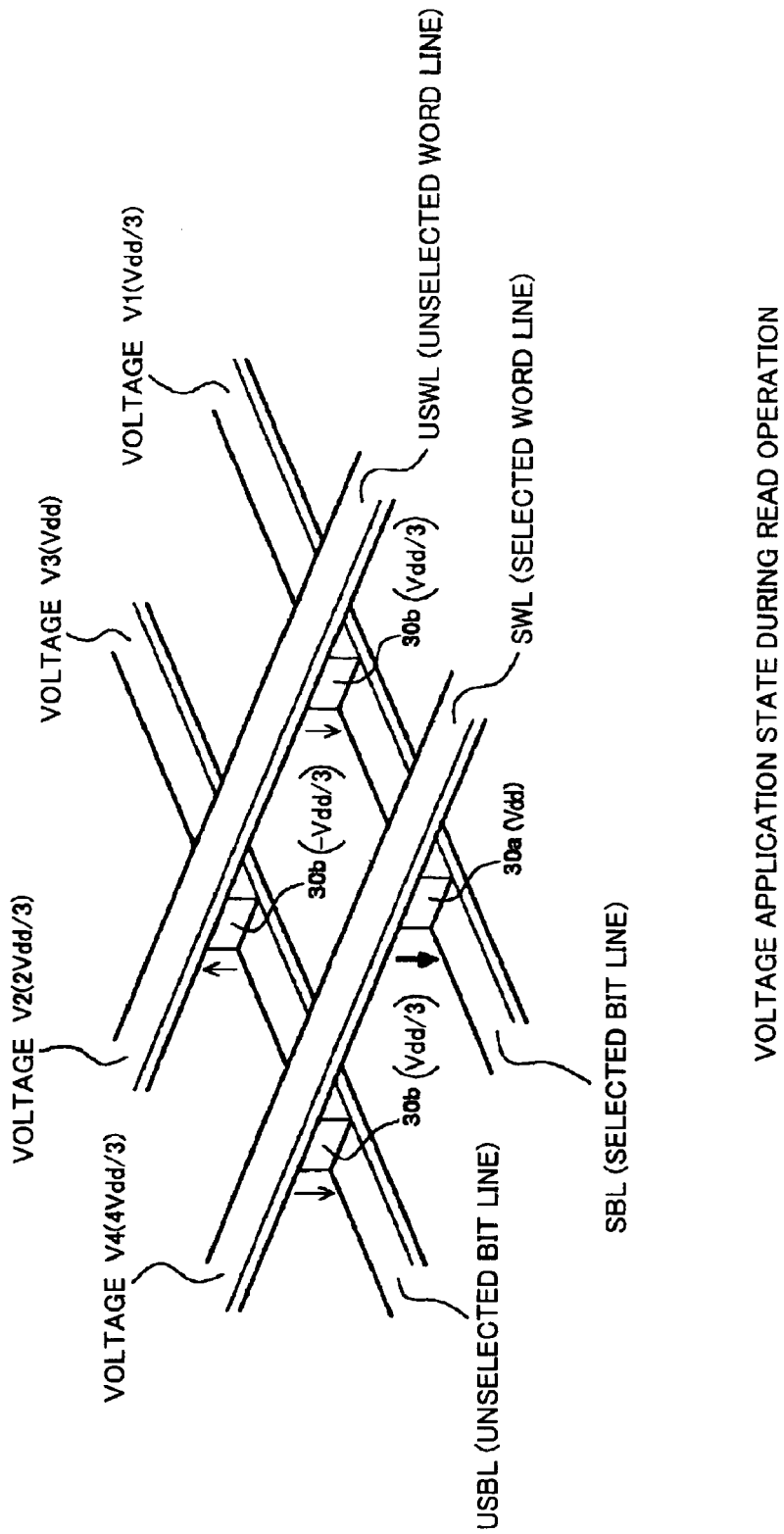
FIG. 3 shows a voltage application state of a ferroelectric memory device according to an embodiment of the present invention during a read operation.

The read operation (write "0") and the write operation (write "1") are described below. FIG. 3 shows the voltages applied to the memory cells 30 during reading, and FIG. 4 shows the voltages applied to the memory cells 30 during writing.

Figure 4:
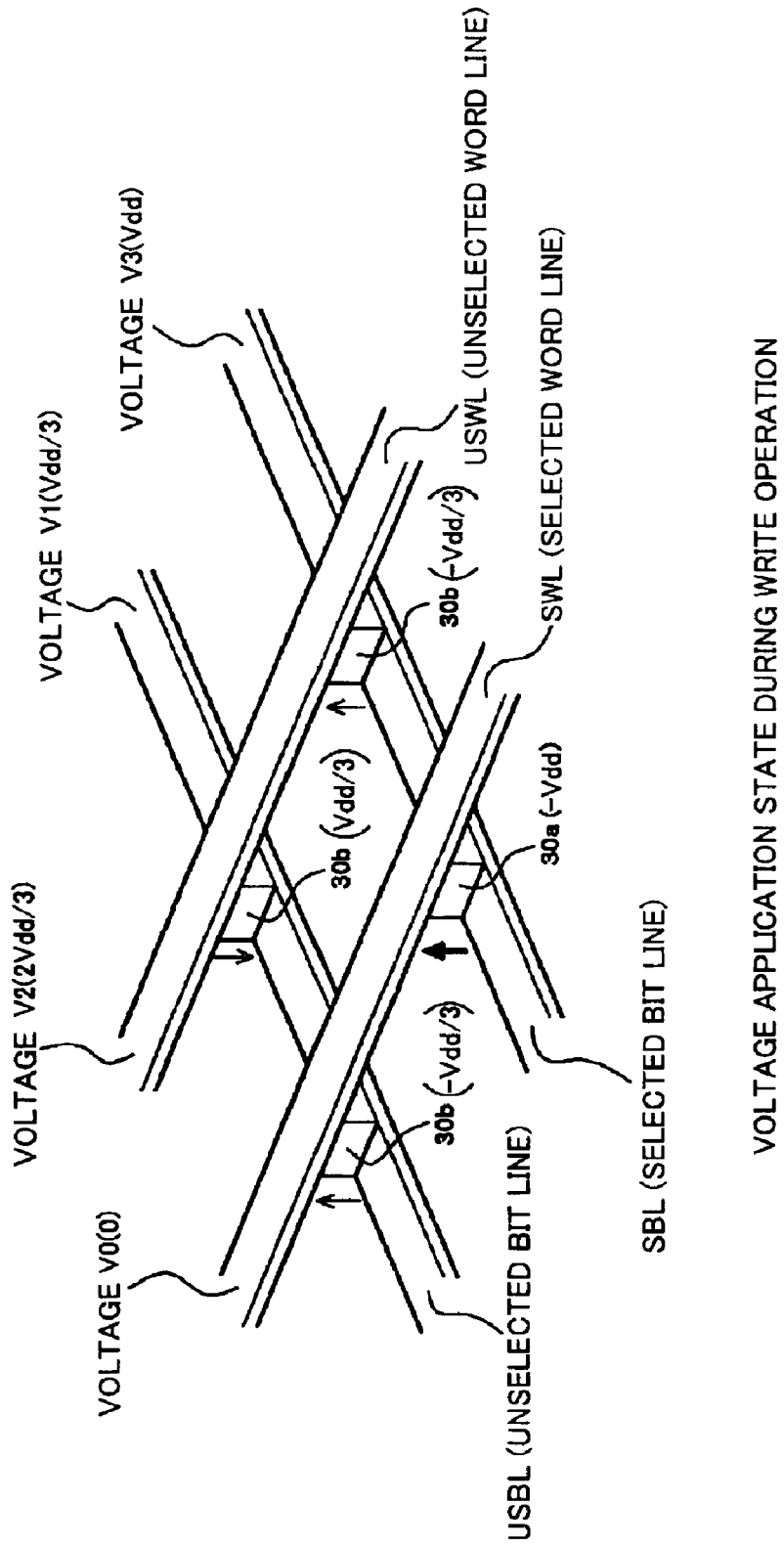
FIG. 4 shows a voltage application state of a ferroelectric memory device according to an embodiment of the present invention during a write operation.

A selected memory cell 30a shown in FIGS. 3 and 4 is the memory cell 30 which is the target of read or write. In FIGS. 3 and 4, a symbol SBL indicates a selected bit line, a symbol USBL indicates an unselected bit line, a symbol SWL indicates a selected word line, and a symbol USWL indicates an unselected word line. In the drawings referred to later, the symbols SBL, USBL, SWL and USWL have the same meaning as described above.

During the reading shown in FIG. 3, the voltage V4 (4Vdd/3) of the voltage supply line 230 for the selected word line and the voltage V1 (Vdd/3) of the voltage supply line 210 for the selected bit line are supplied to the selected memory cell 30a, whereby the positive select voltage (Vdd) is applied. This causes "0" to be written as shown in FIG. 2, whereby data is read.

During the writing shown in FIG. 4, the voltage V0 (0V) of the voltage supply line 230 for the selected word line and the voltage V3 (Vdd) of the voltage supply line 210 for the selected bit line are supplied to the selected memory cell 30a, whereby the negative select voltage (-Vdd) is applied. This causes "1" to be written as shown in FIG. 2, whereby data is written.

Unselected memory cells 30b shown in FIGS. 3 and 4 indicate the remaining memory cells 30 which are not the targets of read and write. In FIGS. 3 and 4, the unselect voltage (±Vdd/3) is applied to the unselected memory cells 30b.

In the present embodiment, the unselected word lines USWL are set at the voltage V2 (2Vdd/3) during reading shown in FIG. 3 and the subsequent writing shown in FIG. 4. Therefore, the voltage of the voltage supply line 240 for the unselected word line connected with the unselected word lines USWL can be fixed continuously during reading and writing.

The present embodiment aims at reducing the access time by fixing the voltage of the voltage supply line 240 for the unselected word line to which a large load is connected. The voltage of the voltage supply line 220 for the unselected bit line to which a large load is also connected may be fixed instead of the voltage supply line 240 for the unselected word line as described later (see FIG. 14).

Control Circuit and Voltage Select Circuit

The configurations and operations of the voltage select circuit 300 and the control circuit 510 shown in FIG. 1 are described below.

Figure 5:
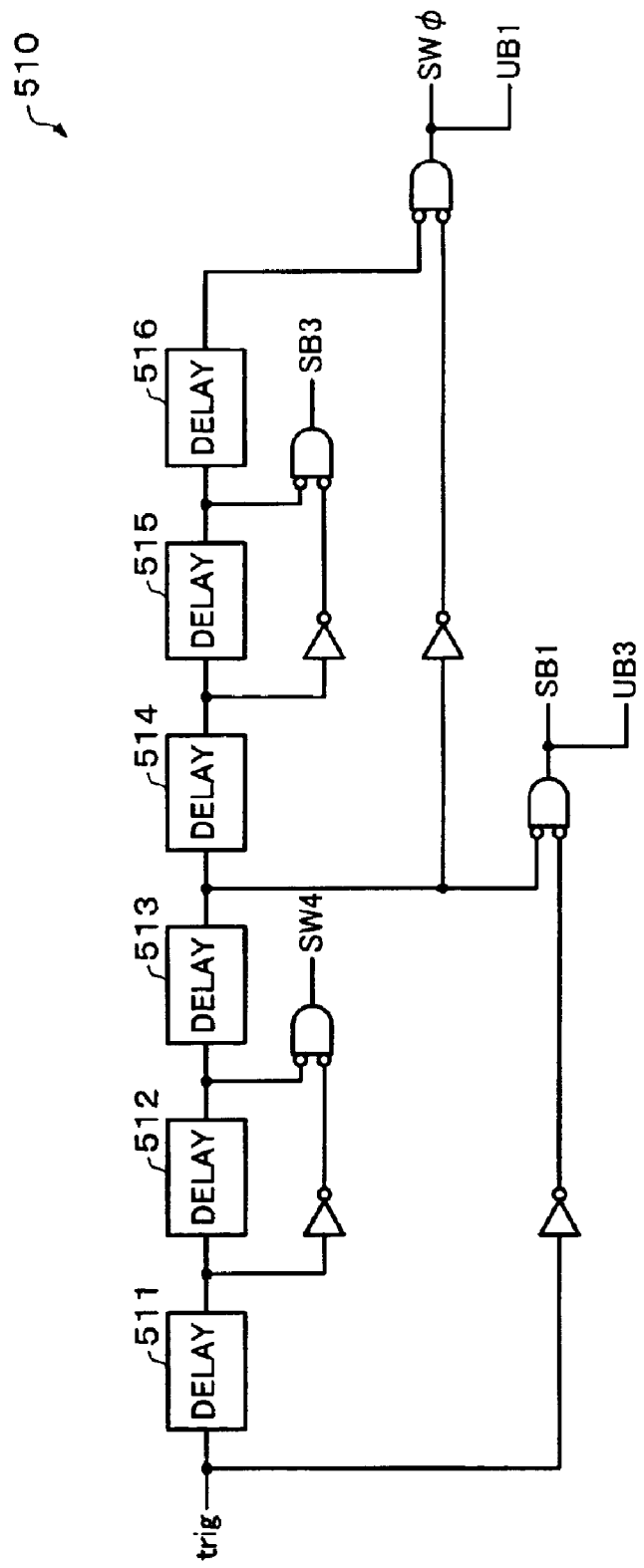
FIG. 5 shows an example of a control circuit shown in FIG. 1.
Figure 6:
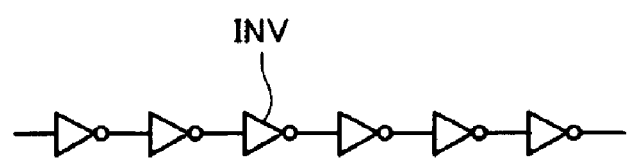
FIG. 6 shows a common configuration of each delay circuit shown in FIG. 5.

FIG. 5 shows an example of the control circuit 510. The control circuit 510 includes six delay circuits 511 to 516. Each of the delay circuits 511 to 516 includes a plurality of inverters INV shown in FIG. 6, and creates constant delay time T1 to T6 shown in FIG. 11.

Figure 7:
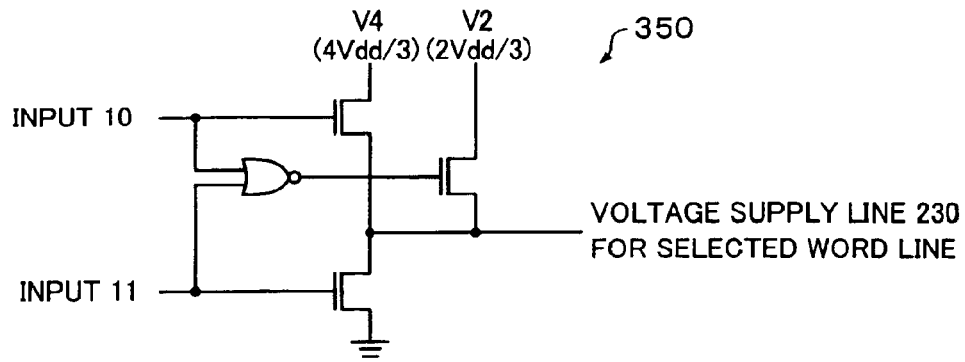
FIG. 7 shows a power supply switch circuit provided in a voltage select circuit shown in FIG. 1.
Figure 8:
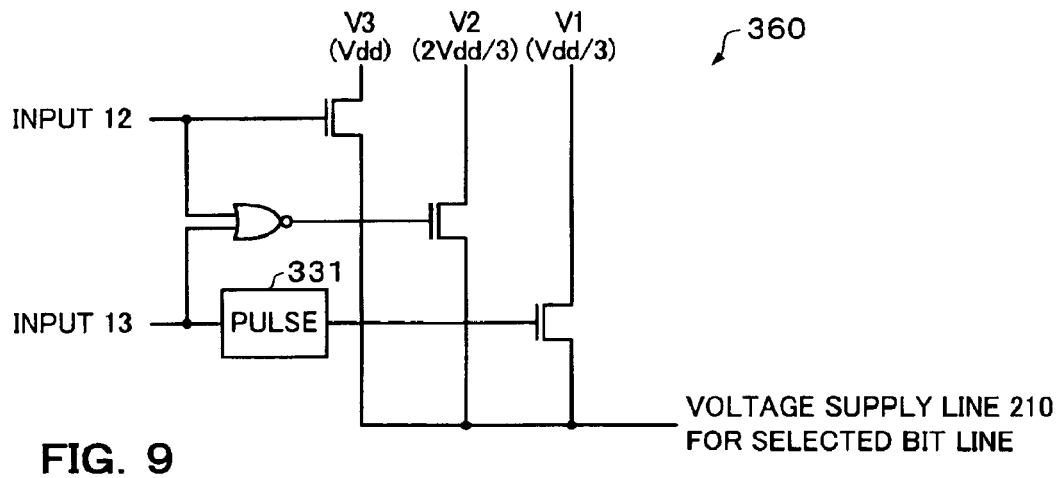
FIG. 8 shows another power supply switch circuit provided in a voltage select circuit shown in FIG. 1.
Figure 9:
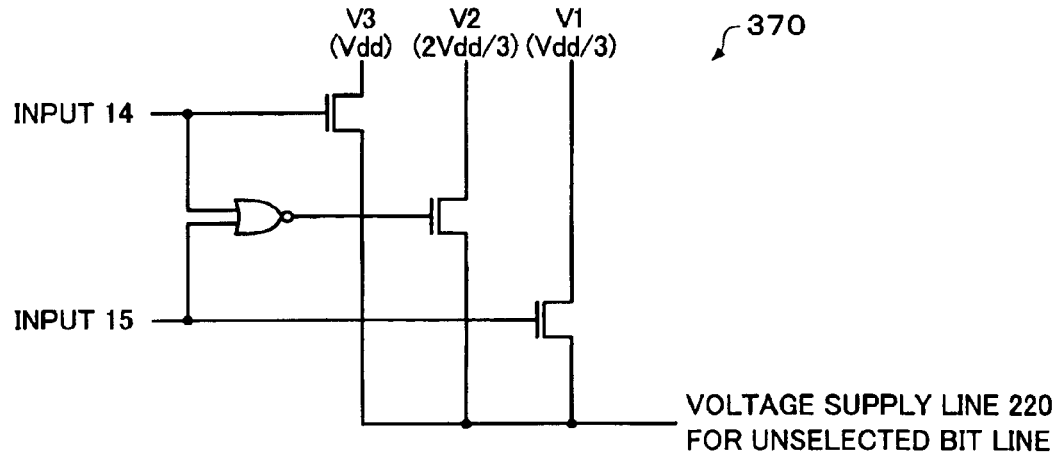
FIG. 9 shows yet another power supply switch circuit provided in a voltage select circuit shown in FIG. 1.

When a signal trig which is output when accessing the selected memory cell is input to the control circuit 510 shown in FIG. 5, signals SW4, SB1, UB3, SW0, and UB1 which control the output voltages of the voltage supply lines 210 to 240 are successively supplied to the voltage select circuit 300 by the functions of the delay circuits 511 to 516. The voltage select circuit 300 determines voltages output to the voltage supply lines 210 to 240 based on the signals which have been received. In the voltage select circuit 300, a switch circuit for processing the received signals is provided in units of the voltage supply lines 210 to 240. FIGS. 7, 8, and 9 show the switch circuits provided in the voltage select circuit 300.

Figure 10:
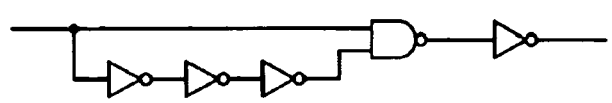
FIG. 10 shows a pulse circuit used in the power supply switch circuit shown in FIG. 8.

A power supply switch circuit 350 shown in FIG. 7 is provided for the voltage supply line 230 for the selected word line. A power supply switch circuit 360 shown in FIG. 8 is provided for the voltage supply line 210 for the selected bit line. A power supply switch circuit 370 shown in FIG. 9 is provided for the voltage supply line 220 for the unselected bit line. The feature of the present embodiment is that the constant voltage is supplied to the voltage supply line 240 for the unselected word line. Therefore, a power supply switch circuit is unnecessary for the voltage supply line 240 for the unselected word line. FIG. 10 shows an equivalent circuit of a pulse circuit 331 shown in FIG. 8.

When the signal SW4 shown in FIG. 5 is input to an input 10 shown in FIG. 7, the voltage 4Vdd/3 is output to the voltage supply line 230 for the selected word line. When the signal SW0 shown in FIG. 5 is input to an input 11 shown in FIG. 7, the voltage 0 is output to the voltage supply line 230 for the selected word line. When no signal is input to the input 10 and the input 11 shown in FIG. 7, the voltage 2Vdd/3 is output to the voltage supply line 230 for the selected word line.

When the signal SB3 shown in FIG. 5 is input to an input 12 shown in FIG. 8, the voltage Vdd is output to the voltage supply line 210 for the selected bit line. When the signal SB1 shown in FIG. 5 is input to an input 13 shown in FIG. 8, the voltage Vdd/3 is temporarily output to the voltage supply line 210 for the selected bit line by the pulse circuit 331 shown in FIG. 8. When no signal is input to the input 12 and the input 13 shown in FIG. 8, the voltage 2Vdd/3 is output to the voltage supply line 210 for the selected bit line.

When the signal UB3 shown in FIG. 5 is input to an input 14 shown in FIG. 9, the voltage Vdd is output to the voltage supply line 220 for the unselected bit line. When the signal UB1 shown in FIG. 5 is input to an input 15 shown in FIG. 9, the voltage Vdd/3 is output to the voltage supply line 220 for the unselected bit line. When no signal is input to the input 14 and the input 15 shown in FIG. 9, the voltage 2Vdd/3 is output to the voltage supply line 220 for the unselected bit line.

Figure 11:
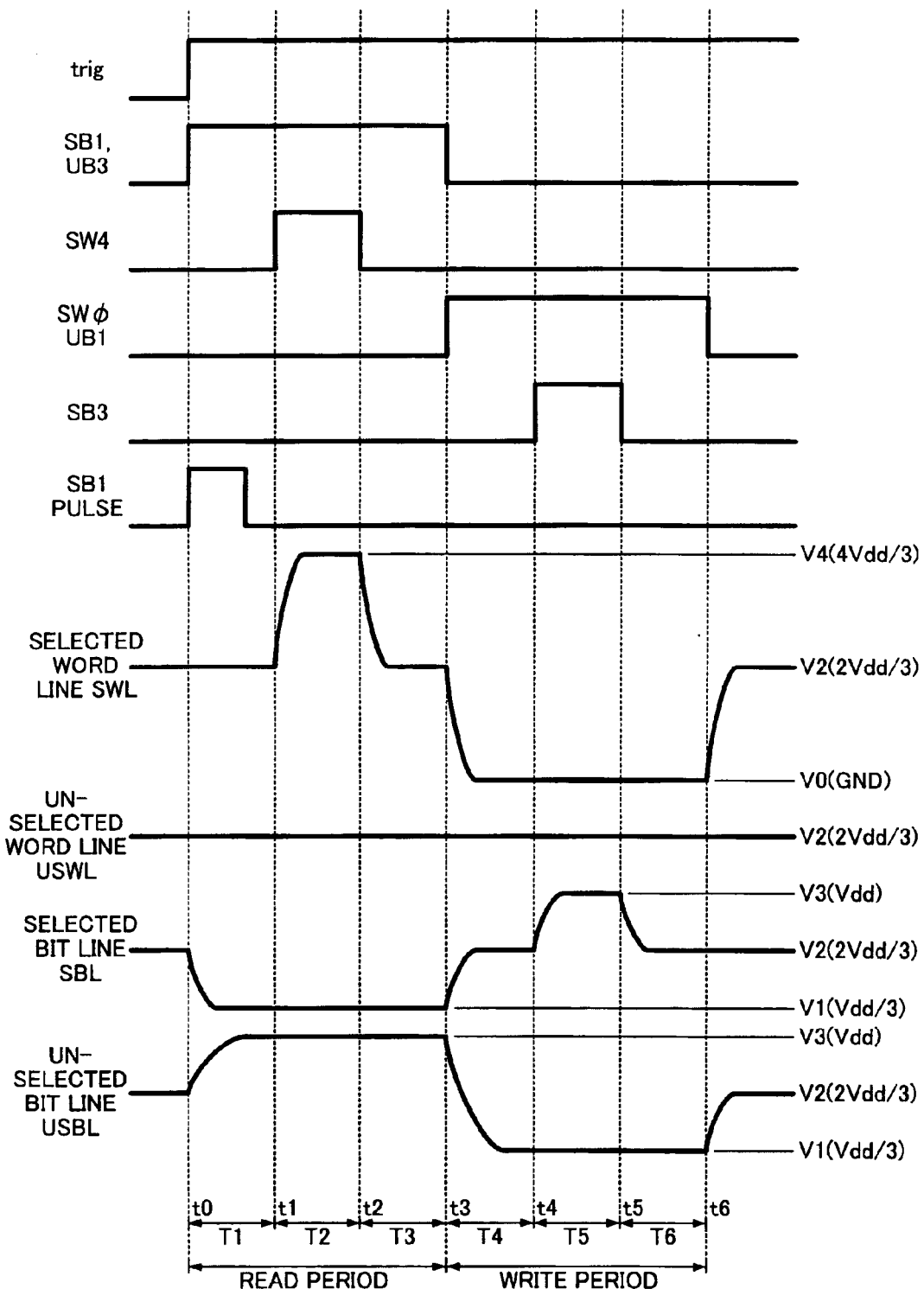
FIG. 11 is a timing chart illustrating the operation in an embodiment of the present invention.

FIG. 11 shows a timing chart of each of the signals (SW4, SW0, SB3, SB1, UB3, UB1) output from the control circuit 510 shown in FIG. 5 and a waveform diagram of the voltages output to the voltage supply lines 210 to 240 from the voltage select circuit 300 in time series. In FIG. 11, symbols t0 to t6 indicate times.

In FIG. 11, when the signal trig is input to the control circuit 510 shown in FIG. 5 at the time t0, the signals SB1 and UB3 rise at the same time. The voltage Vdd/3 is supplied to the selected bit line SBL through the voltage supply line 210 for the selected bit line, and the voltage Vdd is supplied to the unselected bit line USBL through the voltage supply line 220 for the unselected bit line. The voltages of the selected bit line SBL and the unselected bit line USBL become stable in a time interval T1, as shown in FIG. 11.

The signal SW4 rises at the time t1, whereby the voltage 4Vdd/3 is supplied to the selected word line SWL through the voltage supply line 230 for the selected word line. The signal SW4 falls at the time t2, whereby a state in which no signal is input to the power supply switch circuit 350 is established and the voltage 2Vdd/3 is supplied to the selected word line SWL through the voltage supply line 230 for the selected word line.

The positive select voltage (Vdd) is applied to the selected memory cell 30a in a time interval T2 between the time t1 and the time t2 as shown in FIG. 3, whereby read (write "0") is carried out. The voltage of the selected word line SWL which has been allowed to fall becomes stable in a time interval T3. A period including T1 to T3 between the time t0 and the time t3 is the read operation period.

The feature of the present embodiment is the change in voltage in the next time interval T4. The signal SB1 rises and the signal UB3 falls at the time t3. Therefore, a state in which no signal is input to the power supply switch circuit 360 is established, whereby the voltage 2Vdd/3 is supplied to the selected bit line SBL through the voltage supply line 210 for the selected bit line. The voltage Vdd/3 is output to the unselected bit line USBL through the voltage supply line 220 for the unselected bit line by allowing the signal UB1 to rise.

The signals SB1 and UB3 fall and the signals SW0 and UB1 rise at the time t3. The voltage 0 is supplied to the selected word line SWL through the voltage supply line 230 for the selected word line.

In the present embodiment, the voltages of the selected word line SWL and the unselected bit line USBL are allowed to fall and the voltage of the selected bit line SBL is allowed to rise at the same time in the time interval T4, as shown in FIG. 11.

The signal SB3 rises at the time t4, whereby the voltage Vdd is supplied to the selected bit line SBL through the voltage supply line 210 for the selected bit line. The signal SB3 falls at the time t5 after a time interval T5, whereby a state in which no signal is input to the power supply switch circuit 360 is established. Therefore, the voltage 2Vdd/3 is supplied to the selected bit line SWL through the voltage supply line 210 for the selected bit line.

The negative select voltage (−Vdd) is applied to the selected memory cell 30a in the time interval T5 between the time t4 and the time t5 as shown in FIG. 4, whereby write (write "1") is carried out. The voltage of the selected bit line SBL becomes stable in the subsequent time interval T6. A period including T4 to T6 between the time t3 and the time t6 shows the write operation.

The signals SW0 and UB1 fall at the time t6, whereby all the lines are set at the voltage 2Vdd/3 (standby state).

Figure 12:
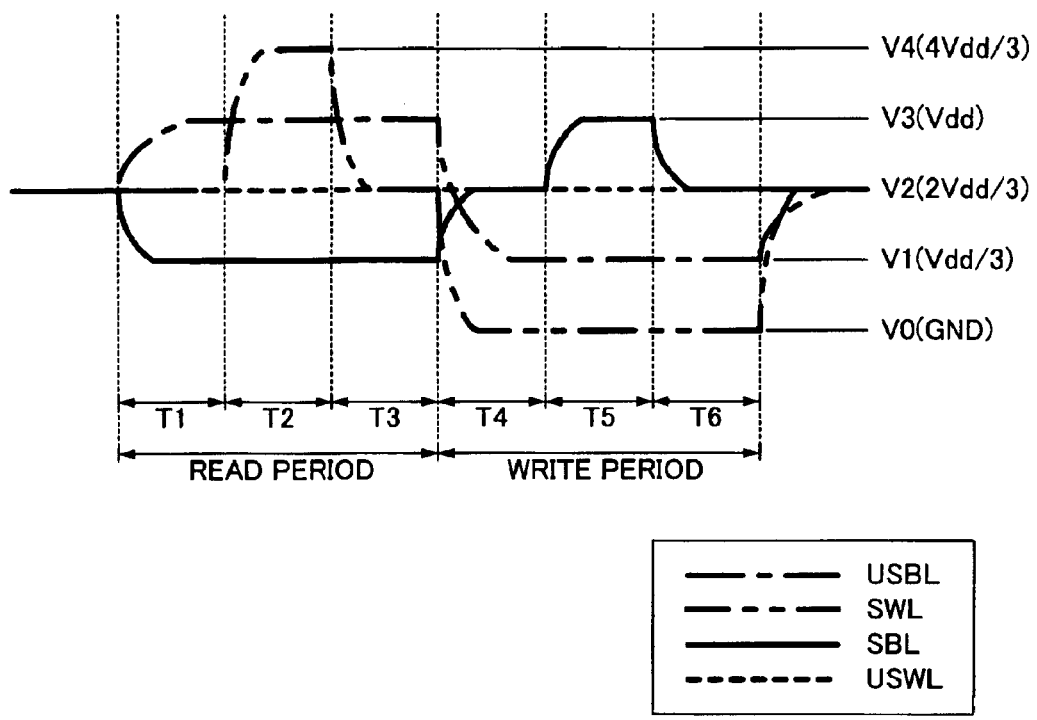
FIG. 12 shows four waveforms shown in FIG. 11 for illustrating the difference of the waveforms.

FIG. 12 shows the four waveforms shown in FIG. 11 so as to overlap so that the relation between the voltages is readily understood. In FIG. 12, since the voltage supplied to the unselected word lines USWL is fixed, it suffices to change only the voltage of the unselected bit lines USBL for the unselected memory cells. Therefore, a period necessary to allow the voltage of the unselected bit lines USBL having a large interconnect capacitance to become stable can be eliminated, whereby the access speed can be increased.

Figure 13:
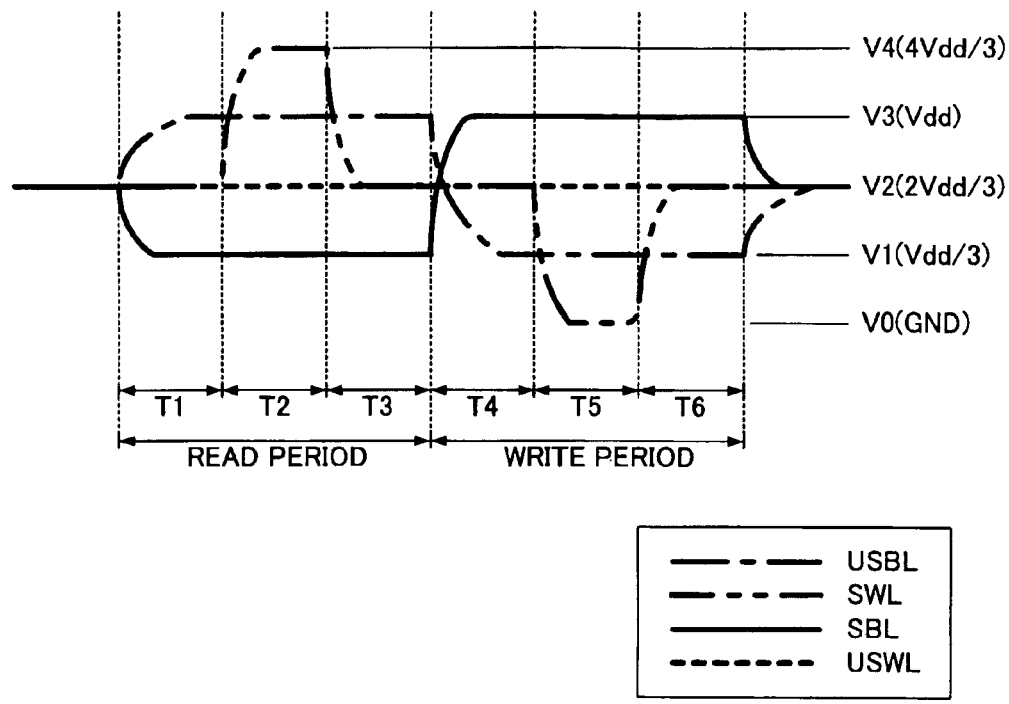
FIG. 13 shows another example of the waveforms shown in FIG. 12.

As shown in FIG. 13, the same effect can be obtained by controlling the application of the voltages so that the voltage Vdd is applied to the selected bit line SBL after the read period and the voltage GND is then applied to the selected word line SWL.

Figure 14:
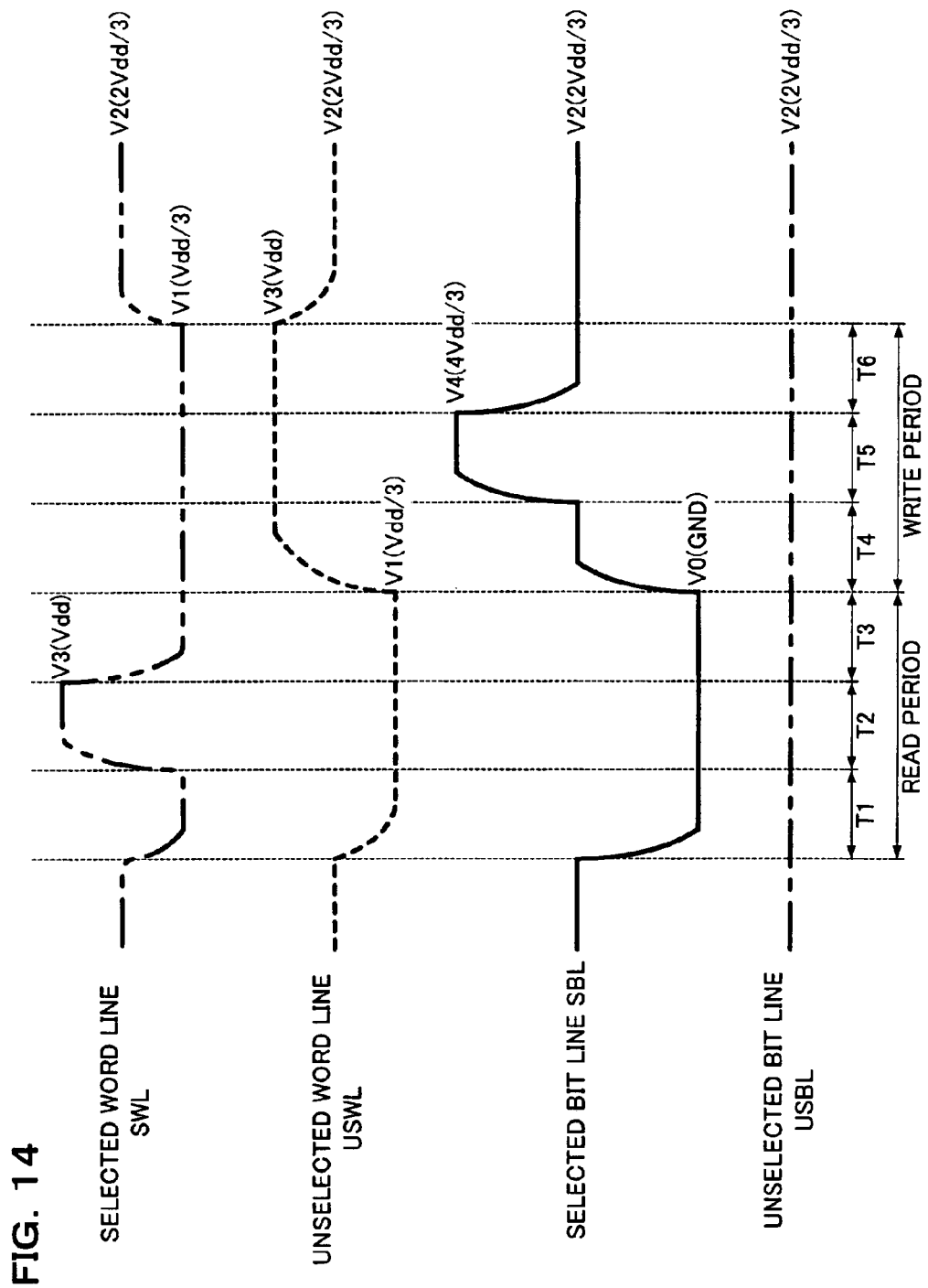
FIG. 14 shows a voltage application waveform diagram in another embodiment of the present invention.

In the present embodiment, the voltage supplied to the unselected word lines USWL is fixed. However, the same effect can be obtained by fixing the voltage supplied to the unselected bit lines USBL. FIG. 14 shows a waveform diagram of the voltages applied to the selected word line SWL, the unselected word line USWL, the selected bit line SBL, and the unselected bit line USBL in this case.

In FIG. 14, in the read period (T2) in which the positive select voltage (Vdd) is applied to the selected memory cell, the voltage 2Vdd/3 is supplied to the voltage supply line 230 for the selected word line, the voltage Vdd/3 is supplied to the voltage supply line 240 for the unselected word line, and the voltage 0 is supplied to the voltage supply line 210 for the selected bit line. In the write period (T5) in which the negative select voltage (−Vdd) is applied to the selected memory cell, the voltage Vdd/3 is supplied to the voltage supply line 230 for the selected word line, the voltage Vdd is supplied to the voltage supply line 240 for the unselected word line, and the voltage 4Vdd/3 is supplied to the voltage supply line 210 for the selected bit line.

After the time interval T2 in which the positive select voltage (Vdd) is applied to the selected memory cell, the voltage Vdd of the voltage supply line 230 for the selected word line is changed to the voltage Vdd/3. In the subsequent time interval T3, the voltage Vdd/3 of the voltage supply line 240 for the unselected word line is changed to the voltage Vdd and the voltage 0 of the voltage supply line 210 for the selected bit line is changed to the voltage 2Vdd/3 substantially at the same time.

Comparison Between Present Embodiment and Comparative Example

Figure 15:
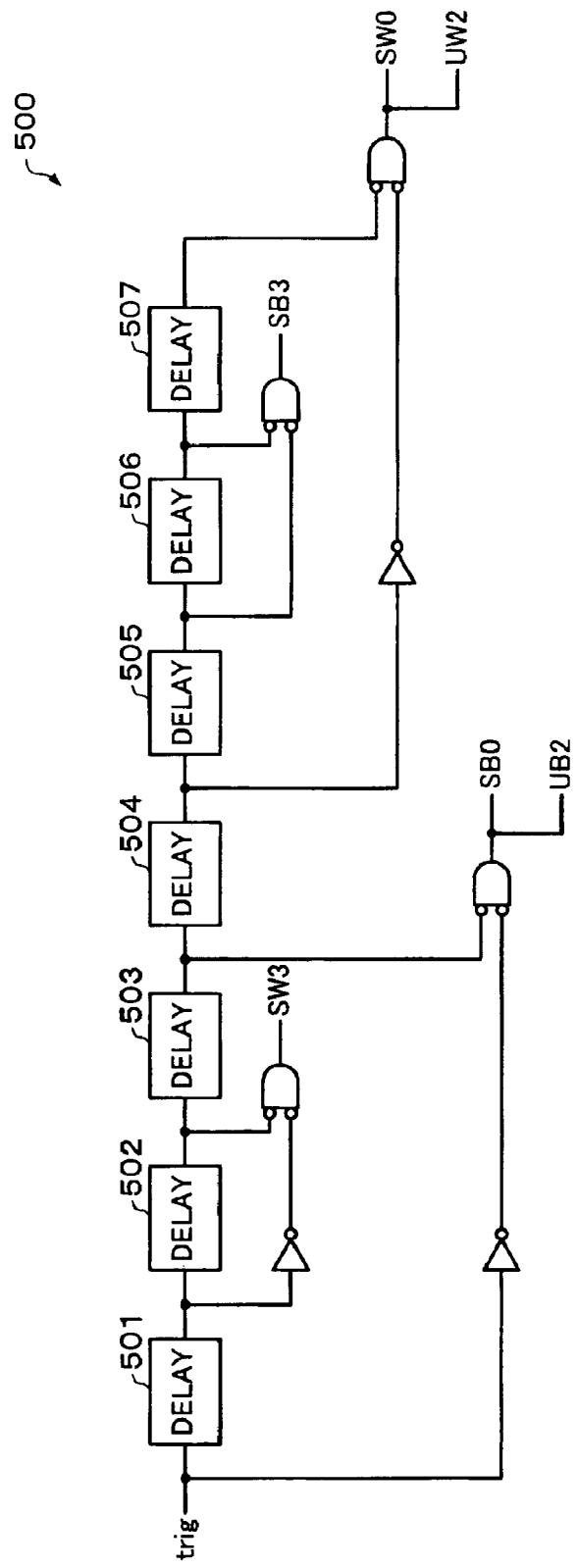
FIG. 15 shows a control circuit in a comparative example.
Figure 16:
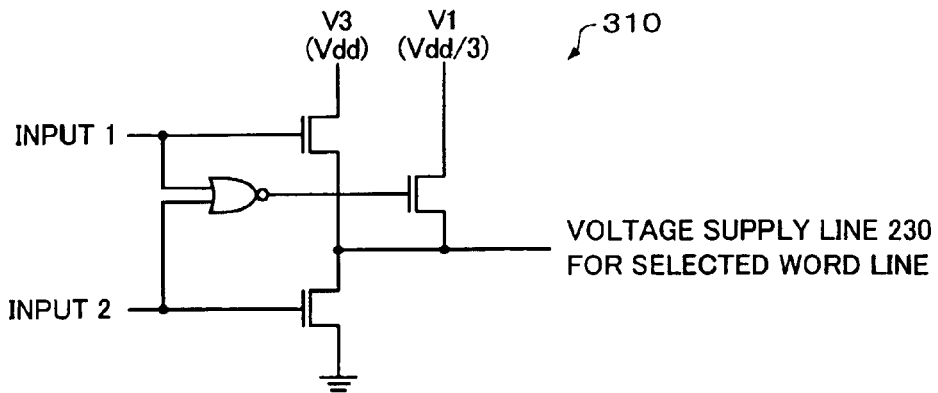
FIG. 16 shows a power supply switch circuit used in the comparative example.
Figure 17:
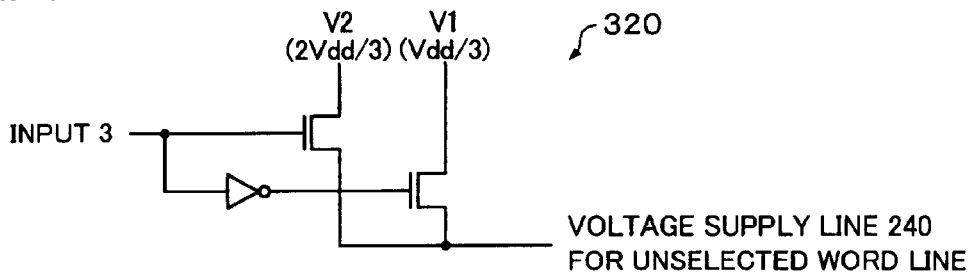
FIG. 17 shows another power supply switch circuit used in the comparative example.

A comparative example is illustrated below in order to describe the effect of the present embodiment. FIG. 15 shows a control circuit 500 according to the comparative example. The control circuit 500 shown in FIG. 15 includes seven delay circuits 501 to 507, which is one too many in comparison with the control circuit shown in FIG. 5. The configuration of the delay circuits 501 to 507 is the same as the configuration shown in FIG. 6. Therefore, the access time in the comparative example is increased more than the access time in the present embodiment for a period of time corresponding to one delay circuit.

Figure 18:
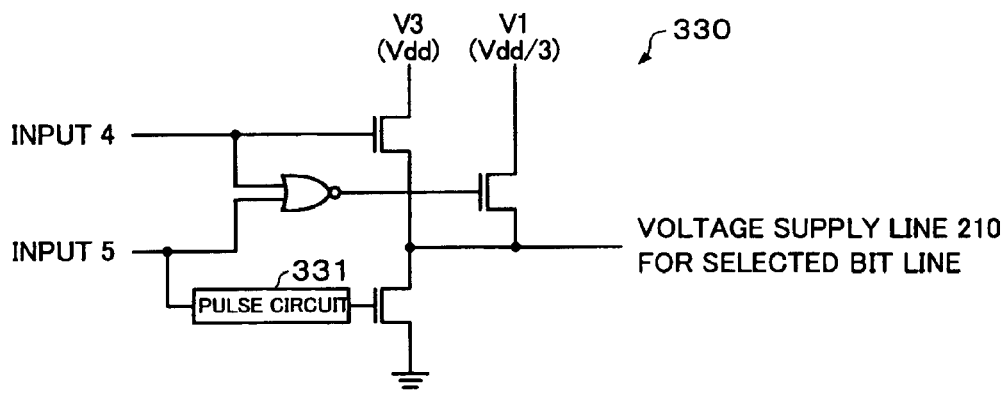
FIG. 18 shows another power supply switch circuit used in the comparative example.
Figure 19:
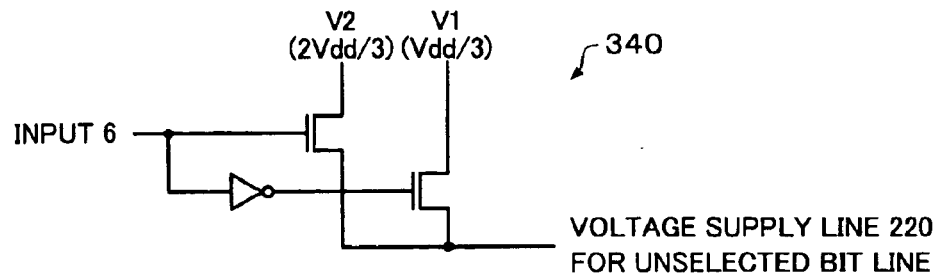
FIG. 19 shows yet another power supply switch circuit used in the comparative example.

A power supply switch circuit in the voltage select circuit controlled by the control circuit 500 includes four power supply switch circuits 310, 320, 330, and 340 shown in FIGS. 16 to 19, differing from the power supply switch circuits shown in FIGS. 7 to 9. The pulse circuit 331 shown in FIG. 18 is the same as the pulse circuit 331 shown in FIG. 10.

Figure 20:
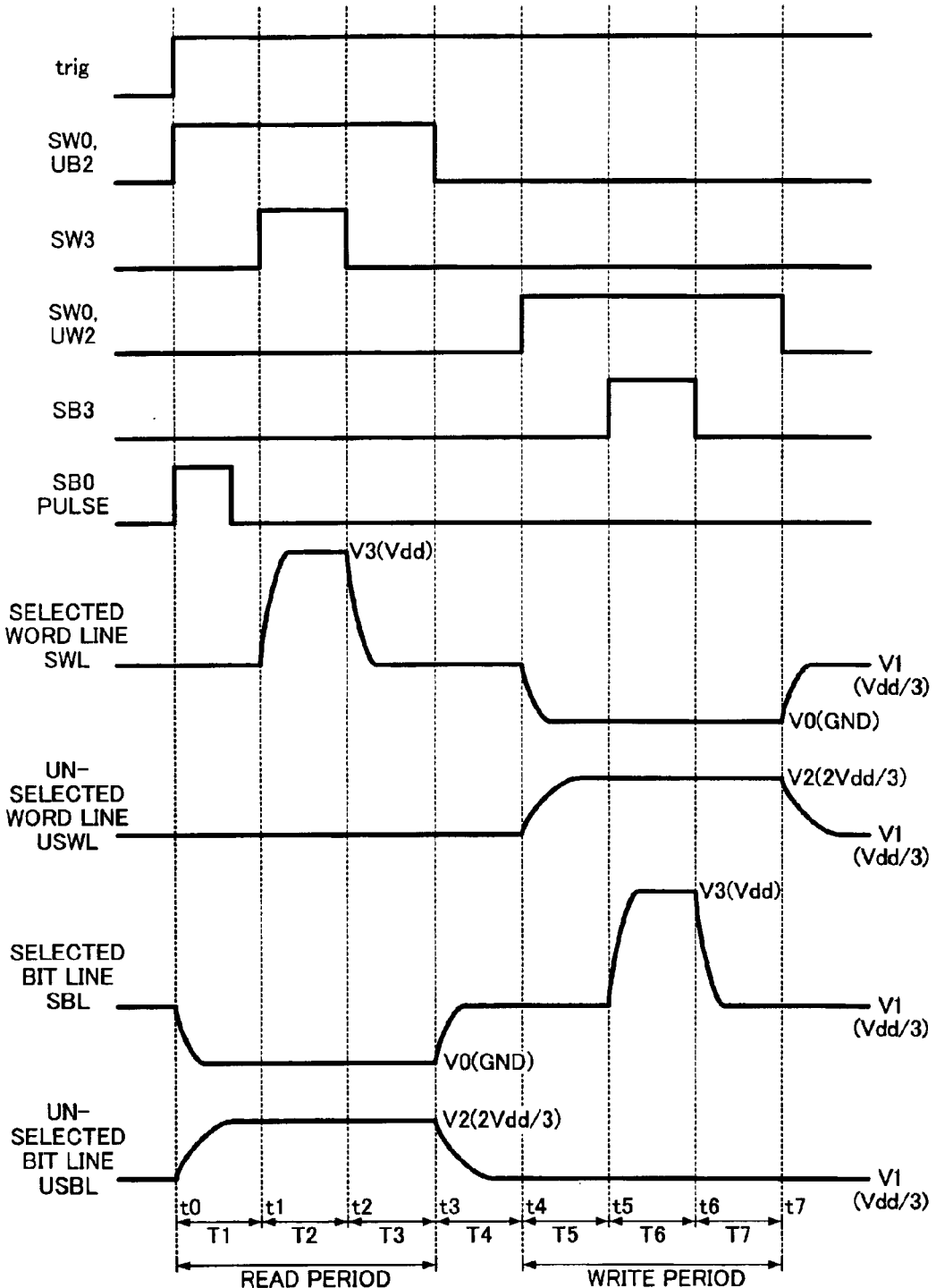
FIG. 20 is a timing chart illustrating the operation in the comparative example.
Figure 21:
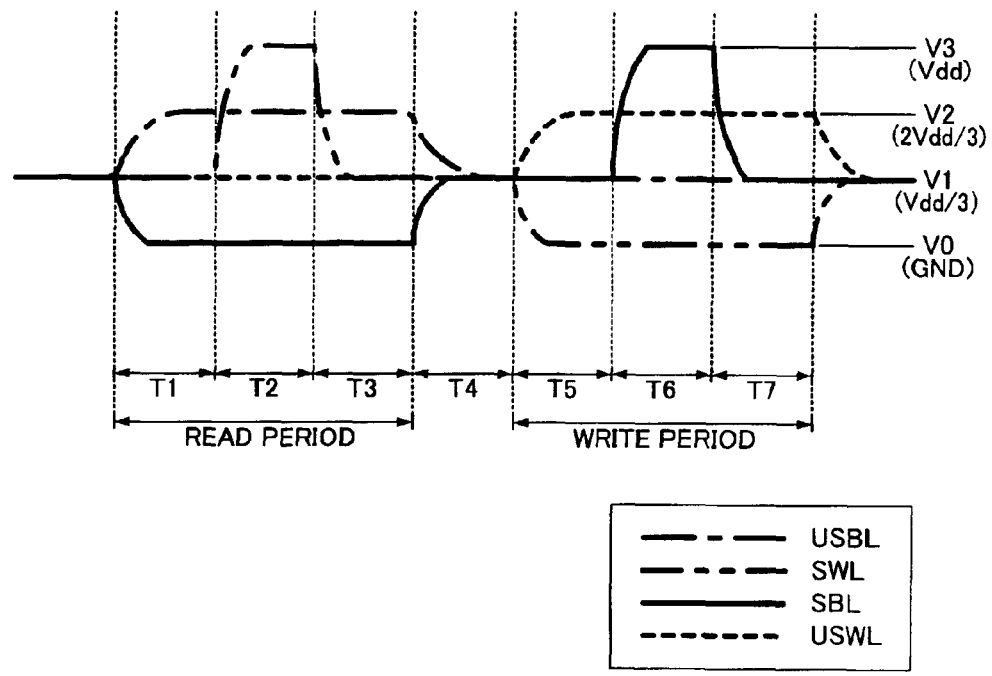
FIG. 21 shows four waveforms shown in FIG. 20 for illustrating the difference of the waveforms.

FIG. 20 shows a timing chart of the signals output from the control circuit 500 shown in FIG. 15 and a waveform diagram of the voltages output to the voltage supply lines 210 to 240 by the voltage select circuit 300 in time series. The voltages applied to the selected word line SWL, the unselected word line USWL, the selected bit line SBL, and the unselected bit line USBL are changed by the signals (SB0, UB2, SW3, SW0, UW2, SB3) output from the control circuit 500, as shown in the waveform diagram shown in FIG. 20. FIG. 21 shows the four waveforms shown in FIG. 20 so as to overlap so that the relation between the voltages is readily understood.

As shown in FIGS. 20 and 21, the period T4 in which the voltage of the unselected bit line USBL of which the charge/discharge speed is low due to a large connection load and the period T5 in which the voltage of the unselected word line USWL of which the charge/discharge speed is low due to a large connection load must be separately provided in the comparative example. Therefore, the access speed is decreased in the comparative example.

The present invention is not limited to the above-described embodiments. Various modifications and variations are possible within the spirit and scope of the present invention.

What is claimed is:

1. A ferroelectric memory device comprising:

a plurality of word lines disposed in parallel;

a plurality of bit lines disposed in parallel so as to intersect the word lines;

a plurality of ferroelectric memory cells disposed at respective intersecting points of the word lines and the bit lines;

a word line driver section which drives the word lines;

a bit line driver section which drives the bit lines;

a first voltage supply line and a second voltage supply line which are connected with the word line driver section, the first voltage supply line being used for a selected word line among the word lines, and the second voltage supply line being used for an unselected word line among the word lines;

a third voltage supply line and a fourth voltage supply line which are connected with the bit line driver section, the third voltage supply line being used for a selected bit line among the bit lines, and the fourth voltage supply line being used for an unselected bit line among the bit lines;

a power supply circuit which generates a plurality of types of voltages; and a voltage select circuit which selectively outputs the plurality of types of voltages generated by the power supply circuit to the first voltage supply line, the second voltage supply line, the third voltage supply line, and the fourth voltage supply line, wherein the word line driver section and the bit line driver section apply a select voltage to a selected memory cell among the ferroelectric memory cells, and apply an unselect voltage to a remaining unselected memory cell among the memory cells, and wherein the voltage select circuit fixes a potential of one of the second voltage supply line and the fourth voltage supply line when the select voltage is applied to the selected memory cell.

2. The ferroelectric memory device as defined in claim 1, wherein the power supply circuit generates five types of voltages consisting of a voltage V0, a voltage V1, a voltage V2, a voltage V3 and a voltage V4, a relationship of magnitude of the voltages V0 to V4 being expressed by V0<V1<V2<V3<V4, and wherein the voltage select circuit fixes the second voltage supply line at the voltage V2, supplies the voltage V4 to the first voltage supply line, the voltage V3 to the fourth voltage supply line, and the voltage V1 to the third voltage supply line when the select voltage applied to the selected memory cell is positive, and supplies the voltage V0 to the first voltage supply line, the voltage V1 to the fourth voltage supply line, and the voltage V3 to the third voltage supply line when the select voltage applied to the selected memory cell is negative.

3. The ferroelectric memory device as defined in claim 2, further comprising:

a control circuit which outputs a timing signal for selectively outputting the plurality of types of voltages to the first voltage supply line, the second voltage supply line, the third voltage supply line, and the fourth voltage supply line to the voltage select circuit, wherein the control circuit outputs a signal which causes a voltage supplied to the first voltage supply line to be changed from the voltage V4 to the voltage V2 after the select voltage that is positive has been applied to the selected memory cell, and then outputs a signal which cause a voltage applied to the first voltage supply line to be changed from the voltage V2 to the voltage V0, a voltage applied to the fourth voltage supply line to be changed from the voltage V3 to the voltage V1, and a voltage applied to the third voltage supply line to be changed from the voltage V1 to the voltage V2 substantially at the same time.

4. The ferroelectric memory device as defined in claim 2, further comprising:

a control circuit which outputs a timing signal for selectively outputting the plurality of types of voltages to the first voltage supply line, the second voltage supply line, the third voltage supply line, and the fourth voltage supply line to the voltage select circuit, wherein the control circuit outputs a signal which causes a voltage supplied to the first voltage supply line to be changed from the voltage V4 to the voltage V2 after the select voltage that is positive has been applied to the selected memory cell, and then outputs a signal which cause a voltage applied to the fourth voltage supply line to be changed from the voltage V3 to the voltage V1, and a voltage applied to the third voltage supply line to be changed from the voltage V1 to the voltage V3 substantially at the same time.

5. The ferroelectric memory device as defined in claim 1, wherein the power supply circuit generates five types of voltages consisting of a voltage V0, a voltage V1, a voltage V2, a voltage V3 and a voltage V4, a relationship of magnitude of the voltages V0 to V4 being expressed by V0<V1<V2<V3<V4, and wherein the voltage select circuit fixes the fourth voltage supply line at the voltage V2, supplies the voltage V3 to the first voltage supply line, the voltage V1 to the second voltage supply line, and the voltage V0 to the third voltage supply line when the select voltage applied to the selected memory cell is positive, and supplies the voltage V1 to the first voltage supply line, the voltage V3 to the second voltage supply line, and the voltage V4 to the third voltage supply line when the select voltage applied to the selected memory cell is negative.

6. The ferroelectric memory device as defined in claim 5, further comprising:

a control circuit which outputs a timing signal for selectively outputting the plurality of types of voltages to the first voltage supply line, the second voltage supply line, the third voltage supply line, and the fourth voltage supply line to the voltage select circuit, wherein the control circuit outputs a signal which causes a voltage supplied to the first voltage supply line to be changed from the voltage V3 to the voltage V1 after the select voltage that is positive has been applied to the selected memory cell, and then outputs a signal which cause a voltage applied to the second voltage supply line to be changed from the voltage V1 to the voltage V3, and a voltage applied to the third voltage supply line to be changed from the voltage V0 to the voltage V2 substantially at the same time.

* * * * *